United States Patent
Lu et al.

(10) Patent No.: US 6,542,839 B1
(45) Date of Patent: Apr. 1, 2003

(54) APPARATUS AND METHOD FOR CALIBRATING THE POSITION OF A CASSETTE INDEXER

(75) Inventors: Hsueh-Chin Lu, Hsinchu (TW); Jeng-Ding Tseng, Hsin-Chu (TW); Chi-Wei Chang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 37 days.

(21) Appl. No.: 09/676,321

(22) Filed: Sep. 29, 2000

(51) Int. Cl.$^7$ ................................................. G01C 17/38
(52) U.S. Cl. ........................ 702/94; 702/95; 702/105; 702/150; 700/213; 700/218; 356/399; 356/400; 33/520; 73/1.79; 73/1.81; 250/555.33; 250/559.37; 250/559.38
(58) Field of Search ................................ 356/400, 399; 700/213, 218; 33/520; 73/1.79, 1.81; 702/94, 95, 150, 105; 250/559.33, 559.37, 559.38

(56) References Cited

U.S. PATENT DOCUMENTS 5,625,191 A * 4/1997 Nakamura et al. ..... 250/363.02
6,145,673 A * 11/2000 Burrows et al. ......... 211/41.12
6,300,644 B1 * 10/2001 Beckhart et al. ....... 250/559.33

* cited by examiner

Primary Examiner—John Barlow
Assistant Examiner—Stephen J. Cherry
(74) Attorney, Agent, or Firm—Tung & Associates

(57) ABSTRACT

An apparatus and a method for calibrating the position of a cassette indexer in a semiconductor process machine are described. The apparatus is constructed by a base plate, a top plate and at least two support members rigidly attaching the top plate to the base plate in a parallel relationship. On the bottom side of the top plate, is mounted at least two spaced-apart rows of distance sensors each having at least five sensors capable of sensing a distance in the cavity of the calibration apparatus. After a wafer blade is extended into the cavity of the apparatus, a sensor in the front row and a sensor in the back row can be used to sense a front-to-back tilt of the wafer blade, while two adjacent sensors in the same row can be used to sense a side-to-side tilt of the wafer blade. The signals from the distance sensors are then sent to a processor for calculating the front-to-back and side-to-side levelness of the wafer blade such that a levelness of the cassette indexer can be determined and adjusted, if necessary.

17 Claims, 2 Drawing Sheets

APPARATUS AND METHOD FOR CALIBRATING THE POSITION OF A CASSETTE INDEXER

FIELD OF THE INVENTION

The present invention generally relates to an apparatus and a method for calibrating the position of a cassette indexer in a semiconductor process machine and more particularly, relates to an apparatus and a method for calibrating the position of a cassette indexer by utilizing a calibrator equipped with a plurality of distance sensors for sensing the position of the calibrator, i.e. the position of a cassette indexer relative to a pre-calibrated wafer blade extended into a cavity in the calibrator.

BACKGROUND OF THE INVENTION

In semiconductor fabrication technology, the continuous miniaturization in device fabricated demands stringent requirements in the fabrication environment control. When the feature size in the present fabrication environment is reduced to 0.25 µm or smaller, i.e. to 0.18 µm, a cleanliness class of at least 0.1 (particles per cubic meter) becomes necessary. One of the feasible methods for reducing contamination in environmental control is the utilization of an inert mini-environment. For instance, in order to eliminate micro-contamination and to reduce native oxide growth on silicon wafers, the loading/unloading procedures of a process tool is enclosed in an extremely high cleanliness mini-environment which is constantly flushed with ultra-pure nitrogen without oxygen or moisture.

A typical mini-environment utilized in contamination control is a SMIF (standard mechanical interfaces) apparatus. A wafer cassette can be transported into a process tool through an enclosure known as a SMIF pod situated on top of a SMIF apparatus.

Another form for utilizing SMIF is a SMIF indexer, as shown in FIG. 1. Typically, in the process equipment 10, a wafer cassette 12 can be handled by either a SMIF arm (not shown) or a SMIF indexer 20 for transporting wafers into the process machine 10 for processing. The wafer cassette 12 is first lowered by the indexer 20 into a transport position, as shown in FIG. 1, a wafer blade (not shown) is then extended into the wafer cassette for unloading a wafer from the cassette. The accurate movement and positioning of the cassette indexer 20 is therefore of upmost importance, since any mispositioning of the indexer would cause severe damage to either the wafer blade, the wafer cassette 12, or both. When the indexer is mispositioned, the wafer blade may also strike a wafer and cause wafer breakage. Conventionally, the positioning of the cassette indexer 20 is calibrated by visual examination and therefore, is grossly inaccurate and operator-dependent. Calibration performed by using wafer cassettes fabricated of a plastic material fails to produce accurate calibration since plastic cassettes may be easily deformed. To achieve accurate calibration, a calibrator must be fabricated of a rigid, non-deformable material. The calibrator must also not differ from a SEMI standard. (Semiconductor Equipment and Materials International, 805 E. Middlefield Rd., Mountain View, Calif.).

It is therefore an object of the present invention to provide an apparatus for calibrating the position of a cassette indexer in a semiconductor process machine that does not have the drawbacks or shortcomings of the conventional calibrating apparatus.

It is another object of the present invention to provide an apparatus for calibrating the position of a cassette indexer in a semiconductor process machine that is fabricated of a non-deformable metallic material.

It is a further object of the present invention to provide an apparatus for calibrating the position of a cassette indexer in a semiconductor process machine that is installed with a plurality of distance sensors.

It is another further object of the present invention to provide an apparatus for calibrating the position of a cassette indexer in a semiconductor process machine that is constructed on a SEMI standard fitted base plate.

It is still another object of the present invention to provide an apparatus for calibrating the position of a cassette indexer in a semiconductor process machine that is equipped with at least two spaced-apart rows of distance sensors.

It is yet another object of the present invention to provide an apparatus for calibrating the position of a cassette indexer in a semiconductor process machine that is equipped with a processor for receiving signals from a plurality of distance sensors capable of calculating the levelness of a wafer blade positioned in the apparatus.

It is still another further object of the present invention to provide an apparatus for calibrating the position of a cassette indexer in a semiconductor process machine that is capable of determining both the front-to-back tilt and the side-to-side tilt of a wafer blade positioned in a cavity of the apparatus.

It is yet another further object of the present invention to provide a method for calibrating the positioning of a cassette indexer in a semiconductor process machine by determining the levelness of a wafer blade extended into a calibrator utilizing a plurality of distance sensors.

SUMMARY OF THE INVENTION

In accordance with the present invention, an apparatus and a method for calibrating the position of a cassette indexer in a semiconductor process machine are provided.

In a preferred embodiment, an apparatus for calibrating the position of a cassette indexer in a semiconductor process machine is provided which includes a base plate that has a rectangular shape, a uniform thickness and parallel upper and lower surfaces; a top plate that has a uniform thickness and parallel upper and lower surfaces, the top plate has the same shape and size of the base plate; at least two support members for rigidly attaching the top plate to the base plate in a parallel relationship, the two support members being positioned opposite to each other forming a cavity therein; at least two spaced-apart rows of distance sensors each having at least five distance sensors mounted on the lower surface of the top plate for sensing a distance in the cavity, wherein a sensor in a front row and a corresponding sensor in a back row sense a front-to-back tilt while two adjacent sensors in the same row sense a side-to-side tilt of a wafer blade extended into the cavity of the apparatus; and a processor for receiving signals from the distance sensors and for calculating the front-to-back and side-to-side levelness of the wafer blade such that a levelness of the cassette indexer can be determined.

In the apparatus for calibrating the position of a cassette indexer in a semiconductor process machine, the base plate may be a SEMI standard fitted base plate. The base plate, the top plate and the at least two support members may be fabricated of a dimensional stable, rigid material, or may be fabricated of aluminum. The apparatus formed by the base plate, the top and the at least two support members may have a dimension substantially the same as a wafer cassette. The apparatus may further include at least two spaced-apart rows of distance sensors each having at least seven distance sensors. The at least five distance sensors may be optical sensors, or may be sonic sensors. The cassette indexer may be further equipped with an elevating device. The position of the wafer blade may be calibrated before being extended into the cavity of the apparatus. The wafer blade may be extended into the cavity of the apparatus in a direction that is parallel to a base of the process machine. The processor may further include a display unit to graphically indicate the positioning of the wafer blade.

The present invention is further directed to a method for calibrating the positioning of a cassette indexer in a semiconductor process machine which can be carried out by the operating steps of first providing a calibrator formed by a base plate, a top plate and at least two support members rigidly attached to the top plate and the base plate in a parallel relationship and opposite to each other; the base plate may have a rectangular shape, a uniform thickness and parallel upper and lower surfaces; the top plate may have a uniform thickness, parallel upper and lower surfaces and the same shape and size of the base plate; providing at least two spaced-apart rows of distance sensors each having at least five distance sensors for mounting to the lower surface of the top plate for sensing a distance in the cavity; positioning the calibrator on top of a cassette indexer; extending a pre-calibrated wafer blade into a cavity of the apparatus; sensing a front-to-back tilt of the wafer blade by a sensor in a front row and a corresponding sensor in a back row; sensing a side-to-side tilt of the wafer blade by two adjacent sensors in the same row; sending signals from the distance sensors to a processor and calculating a front-to-back levelness and a side-to-side levelness of the wafer blade; and determining a levelness of the cassette indexer.

The method for calibrating the positioning of a cassette indexer in a semiconductor process machine may further include the step of providing a display unit in the processor to graphically illustrate the levelness of the wafer blade. The method may further include the step of sensing a distance in the cavity by the at least five distance sensors by an optical means, or by the at least five distance sensors utilizing sonic means. The method may further include the step of correcting the levelness of the cassette indexer based on signals received by the processor.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus for calibrating the position of a cassette indexer (or a SMIF indexer) in a semiconductor process machine. The invention also discloses a method for calibrating the positioning of a cassette indexer in a semiconductor process machine by utilizing a novel calibrator equipped with a plurality of distance sensors.

The present invention novel calibrator utilizes a plurality of distance sensors installed on a bottom surface of a top plate of a calibrator to detect a transfer position of a wafer blade. Since the position of the wafer blade in a transfer position is precalibrated, any deviation from the standard position measured by the calibrator indicates that the cassette indexer on which the calibrator is positioned is out of calibration. The present invention novel calibration tool not only can calibrate the levelness between the wafer blade and the cassette indexer, but also can be used to detect the transfer slot pitch. By utilizing the present invention novel calibrator and the method for calibration, the time required for calibrating a cassette indexer can be greatly shortened. The novel calibrator can further provide an accurate distance during transfer.

When the processor of the calibrator is provided with a display unit, an image can be obtained of the wafer blade with dimensions shown when suitable software is utilized such that the cassette slot pitch can be accurately measured.

Figure 2:
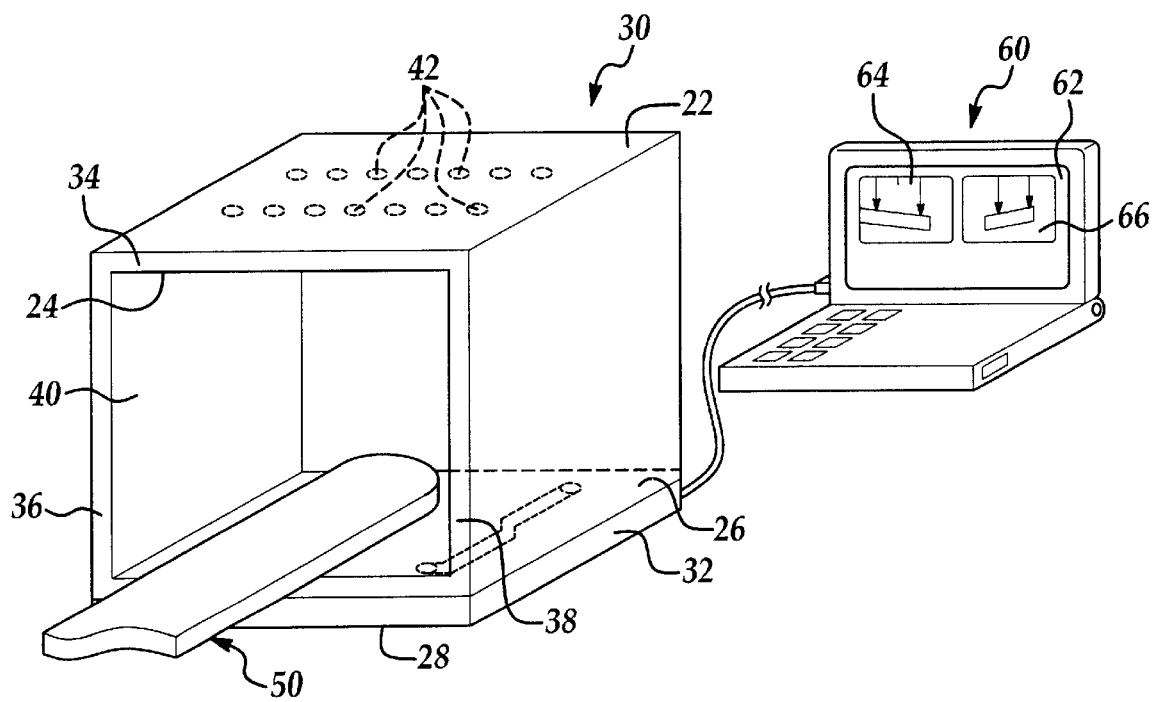
FIG. 2 is a perspective view of a present invention calibrator equipped with a processor and a display unit.

Referring now to FIG. 2, wherein a present invention calibrator 30 is shown. The calibrator 30 is constructed by a base plate 32, a top plate 34 and at least two support members 36,38. The top plate 34 has a uniform thickness and parallelly situated upper surface 22 and lower surface 24. The base plate 32 has a rectangular shape, a uniform thickness and parallelly situated upper surface 26 and lower surface 28. The top plate 34 has substantially the same shape and size of the base plate 32. At least two support members, or support plates 36,38 are used to rigidly attach the top plate 34 to the base plate 32 in a parallel relationship. The two support members 36,38 are positioned opposite to each other forming a cavity 40 therein.

In the present invention novel calibrator 30, at least two spaced-apart rows of distance sensors 42 each has at least five distance sensors are mounted on the lower surface 24 of the top plate 34 for sensing a distance in the cavity. A more suitable number of distance sensors may be seven in each row. A sensor 42 in a front row and a corresponding sensor 42 in a back row sense a front-to-back tilt of the wafer blade 50 when extended into the cavity 40 of the apparatus. Two adjacent sensors 42 in the same row sense a side-to-side tilt of the wafer blade 50. A processor 60 is connected to the calibrator 30 for receiving signals from the distance sensors 42 and for calculating the front-to-back and side-to-side levelness of the wafer blade 50. The processor 60 then calculates a levelness of the cassette indexer on which the calibrator 30 is positioned.

The processor 60 may further be provided with a display screen 62 which may provide an image of the wafer blade 50 with accurate dimensions when suitable computer software is utilized. For instance, as shown in FIG. 2, an image 64 graphically illustrates a front-to-back tilt of the wafer blade 50, while image 66 graphically illustrates a side-to-side tilt of the wafer blade 50.

Figure 1:
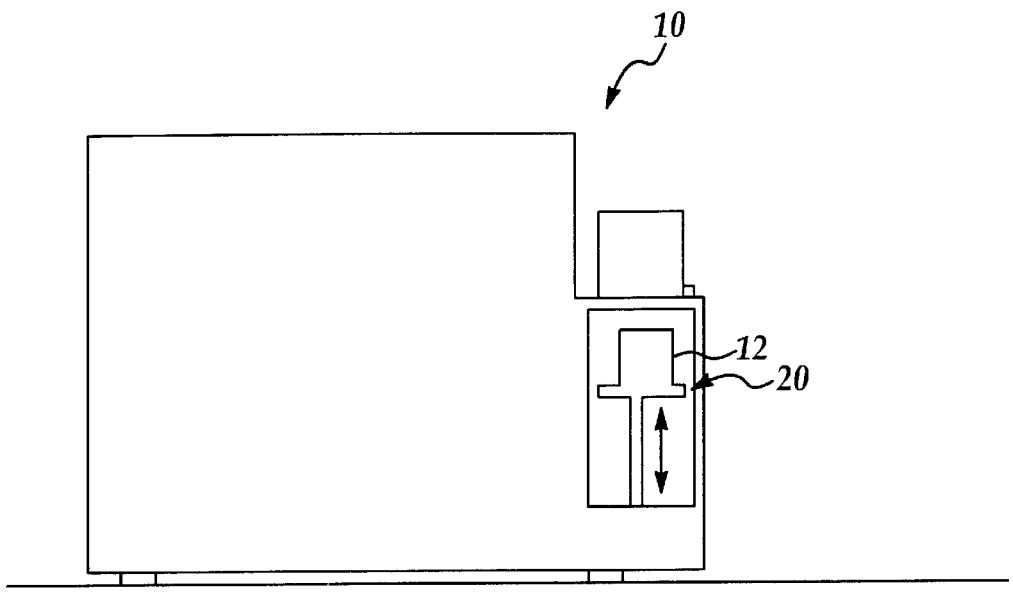
FIG. 1 is an illustration illustrating a conventional semiconductor process machine equipped with a cassette (or SMIF) indexer.

The calibrator 30 should be fabricated of a high rigidity, dimensionally stable material such as a metal. A suitable metal for such fabrication may be aluminum. The calibrator 30 may be positioned on a cassette indexer 20 (such as that shown in FIG. 1) by locating pins for accurate positioning of the calibrator. It should be noted that the calibrator 30 is completely mobile and therefore can be used for calibration from process machine to process machine. The distance sensors 42 can be provided in any suitable types, such as of sensing by optical means or sensing by sonic wave means. Such distance sensors are readily available in the market and therefore will not be discussed in detail. For simplicity reasons, the mounting of the distance sensors 42 and the connection between the sensors 42 and the processor 60 are not shown.

The present invention further discloses a method for calibrating the positioning of a cassette indexer in a semiconductor process machine by first providing a calibrator 30, shown in FIG. 2, equipped with two rows of distance sensors 42. The step-by-step process flow chart for the present invention novel method is shown in FIG. 3.

After the calibrator 30 is positioned on the cassette indexer 20 (of FIG. 1), a wafer blade 50 is first extended into the cavity 40 of the calibrator 30. This is shown as step 72 in FIG. 3 of the process flow chart 70. From a plurality of distance sensors 42 (situated in the two spaced-apart rows), mapping data of the wafer blade 50 can be obtained. By utilizing analog/digital and digital/analog convertors (not shown), the distance data can be calculated by conventional techniques. This is shown in step 74. When the processor 60 is equipped with a display unit 62, a mapping of the wafer blade 50 can be displayed on the processor 60. In the next step 76, the front-to-back position of the wafer blade 50 is first checked relative to the calibrator 30. If the front-to-back position of the wafer blade deviated from that stored in the processor 60, step 78 is executed to adjust the front-to-back position of the cassette indexer 20. On the other hand, if the front-to-back position of the wafer blade 50 does not deviate from data stored in the processor, step 80 is executed directly from step 76 to check the side-to-side position of the wafer blade 50 relative to the calibrator 30. The step 80 may also be executed after step 78, i.e. after the front-to-back position of the cassette indexer is adjusted. After the execution of step 80, if the side-to-side position of the wafer blade 50 deviates from standard data stored in the processor, step 82 is executed to adjust the side-to-side position of the cassette indexer 50. When the side-to-side position of the wafer blade 50 relative to the calibrator 30 does not deviate from the standard data stored in the processor, step 84, which indicates the calibration is completed, is executed. Step 84 may further be executed after step 82 is first executed, i.e. after the side-to-side position of the cassette indexer 20 is adjusted.

Figure 3:
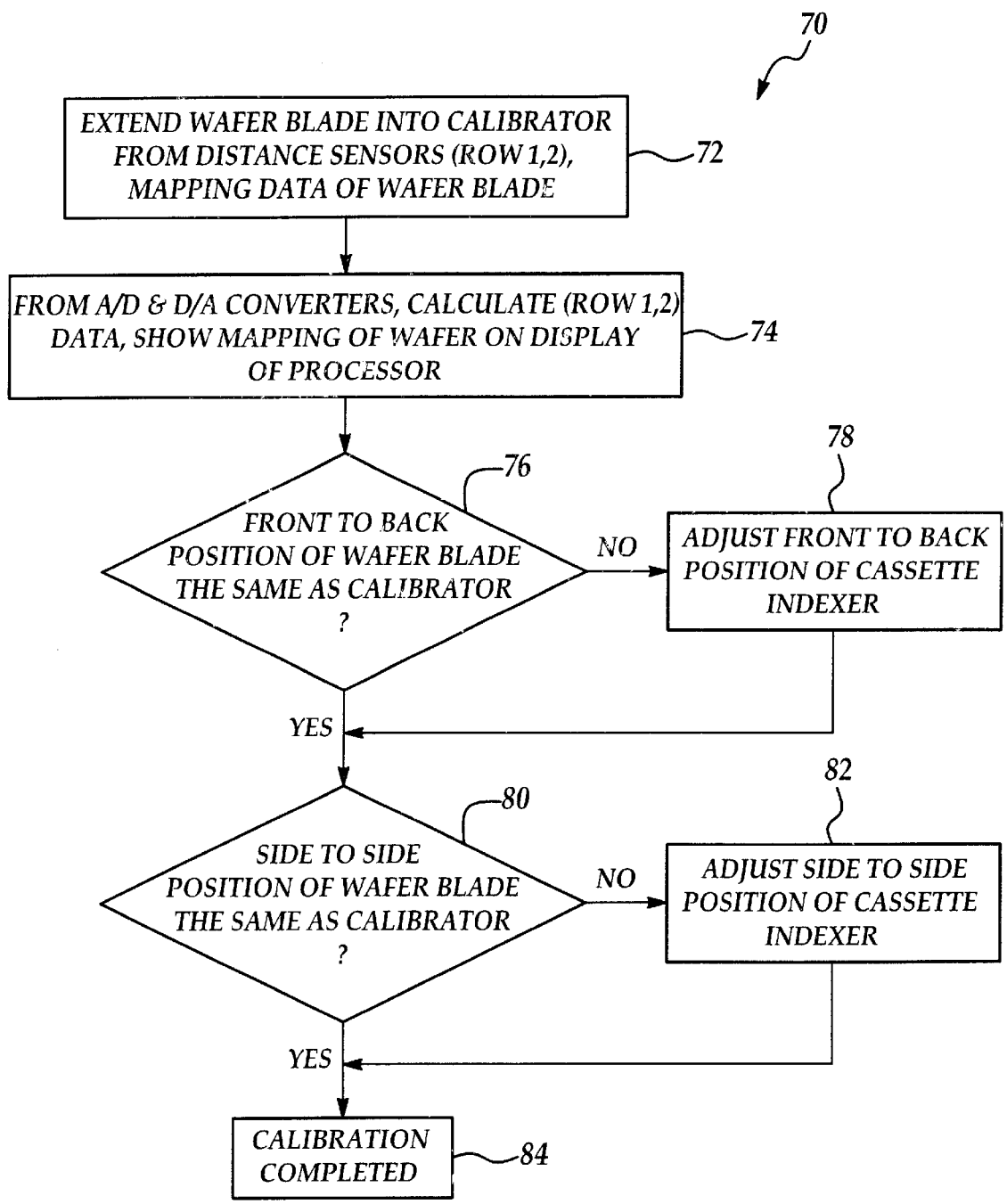
FIG. 3 is a process flow chart of the present invention novel method for calibrating the position of a cassette indexer in a semiconductor process machine.

The present invention apparatus for calibrating the position of a cassette indexer in a semiconductor process machine and a method for utilizing the apparatus for executing such calibration have therefore been amply described in the above description and in the appended drawings of FIGS. 2 and 3.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

We claim:

1. An apparatus for calibrating the position of a cassette indexer in a semiconductor process machine comprising:
    a base plate having a rectangular shape, a uniform thickness and parallel upper and lower surfaces;
    a top plate having a uniform thickness and parallel upper and lower surfaces, said top plate having the same shape and size of said base plate;
    at least two support members for rigidly attaching said top plate to said base plate in a parallel relationship, said two support members being positioned opposite to each other forming a cavity therein;
    at least two spaced-apart rows of distance sensors each having at least five distance sensors mounted on said lower surface of said top plate for sensing a distance in said cavity, wherein a sensor in a front row and a corresponding sensor in a back row sense a front-to-back tilt while two adjacent sensors in the same row sense a side-to-side tilt of a wafer blade extended into said cavity of the apparatus; and
    a processor for receiving signals from said distance sensors and for calculating said front-to-back and said side-to-side levelness of said wafer blade such that a levelness of said cassette indexer is determined.

2. An apparatus for calibrating the position of a cassette indexer in a semiconductor process machine according to claim 1, wherein said base plate is a SEMI (Semiconductor Equipment and Materials International) standard fitted base plate.

3. An apparatus for calibrating the position of a cassette indexer in a semiconductor process machine according to claim 1, wherein said base plate, said top plate and said at least two support members are fabricated of a dimensionally stable, rigid material.

4. An apparatus for calibrating the position of a cassette indexer in a semiconductor process machine according to claim 1, wherein said base plate, said top plate and said at least two support members are fabricated of aluminum.

5. An apparatus for calibrating the position of a cassette indexer in a semiconductor process machine according to claim 1, wherein said apparatus formed by said base plate, said top plate and said at least two support members having a dimension substantially the same as a wafer cassette.

6. An apparatus for calibrating the position of a cassette indexer in a semiconductor process machine according to claim 1 further comprising at least two spaced-apart rows of distance sensors each having at least seven distance sensors.

7. An apparatus for calibrating the position of a cassette indexer in a semiconductor process machine according to claim 1, wherein said at least five distance sensors are optical sensors.

8. An apparatus f or calibrating the position of a cassette indexer in a semiconductor process machine according to claim 1, wherein said at least five distance sensors are sonic sensors.

9. An apparatus for calibrating the position of a cassette indexer in a semiconductor process machine according to claim 1, wherein said cassette indexer is further equipped with an elevating device.

10. An apparatus for calibrating the position of a cassette indexer in a semiconductor process machine according to claim 1, wherein the position of said wafer blade is calibrated before being extended into the cavity of said apparatus.

11. An apparatus for calibrating the position of a cassette indexer in a semiconductor process machine according to claim 1, wherein said wafer blade being extended into said cavity of the apparatus in a direction that is parallel to a base of said process machine.

12. An apparatus for calibrating the position of a cassette indexer in a semiconductor process machine according to claim 1, wherein said processor further comprises a display unit to graphically indicate the positioning of the wafer blade.

13. A method for calibrating the positioning of a cassette indexer in a semiconductor process machine comprising the steps of:

providing a calibrator formed by a base plate, a top plate and at least two support members rigidly attached to the top plate and the base plate in a parallel relationship and opposite to each other, said base plate having a rectangular shape, a uniform thickness and parallel upper and lower surfaces, said top plate having a uniform thickness, parallel upper and lower surfaces and the same shape and size of said base plate;

providing at least two spaced-apart rows of distance sensors each having at least five distance sensors for mounting to said lower surface of said top plate for sensing a distance in said cavity;

positioning said calibrator on top of a cassette indexer;

extending a pre-calibrated wafer blade into a cavity of said apparatus;

sensing a front-to-back tilt of said wafer blade by a sensor in a front row and a corresponding sensor in a back row;

sensing a side-to-side tilt of said wafer blade by two adjacent sensors in the same row;

sending signals from said distance sensors to a processor and calculating a front-to-back levelness and a side-to-side levelness of said wafer blade; and determining a levelness of said cassette indexer.

14. A method for calibrating the positioning of a cassette indexer in a semiconductor process machine according to claim 13 further comprising the step of providing a display unit in said processor to graphically illustrate the levelness of said wafer blade.

15. A method for calibrating the positioning of a cassette indexer in a semiconductor process machine according to claim 13 further comprising the step of sensing a distance in said cavity by said at least five distance sensors by an optical means.

16. A method for calibrating the positioning of a cassette indexer in a semiconductor process machine according to claim 13 further comprising the step of sensing a distance in the cavity by said at least five distance sensors utilizing sonic means.

17. A method for calibrating the positioning of a cassette indexer in a semiconductor process machine according to claim 13 further comprising the step of correcting the levelness of said cassette indexer based on signals received by said processor.

* * * * *